(12) United States Patent
Bangsaruntip et al.

(10) Patent No.: US 9,728,619 B2
(45) Date of Patent: *Aug. 8, 2017

(54) GENERATION OF MULTIPLE DIAMETER NANOWIRE FIELD EFFECT TRANSISTORS

(75) Inventors: Sarunya Bangsaruntip, Mount Kisco, NY (US); Guy M. Cohen, Mohegan Lake, NY (US); Jeffrey W. Sleight, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 90 days.

This patent is subject to a terminal disclaimer.

(21) Appl. No.: 13/610,266

(22) Filed: Sep. 11, 2012

(65) Prior Publication Data

US 2013/0001517 A1    Jan. 3, 2013

Related U.S. Application Data

(63) Continuation of application No. 12/778,534, filed on May 12, 2010, now Pat. No. 8,420,455.

(51) Int. Cl.
| | |
|---|---|
| *H01L 29/423* | (2006.01) |
| *B82Y 10/00* | (2011.01) |
| *H01L 29/06* | (2006.01) |
| *H01L 29/66* | (2006.01) |
| *H01L 29/786* | (2006.01) |

(52) U.S. Cl.
CPC ........ *H01L 29/42392* (2013.01); *B82Y 10/00* (2013.01); *H01L 29/0665* (2013.01); *H01L 29/0673* (2013.01); *H01L 29/66439* (2013.01); *H01L 29/78696* (2013.01)

(58) Field of Classification Search
CPC .................................................... H01L 29/0673
USPC ................ 438/151, 142, 275; 977/762, 938; 257/E29.245, E21.404, 347
See application file for complete search history.

(56) References Cited

U.S. PATENT DOCUMENTS

| | | | |
|---|---|---|---|
| 5,670,417 A * | 9/1997 | Lambson | H01L 29/66272 148/DIG. 10 |
| 5,872,378 A | 2/1999 | Rose et al. | |
| 6,181,193 B1 | 1/2001 | Coughlin, Jr. | |
| 6,207,588 B1 | 3/2001 | Choi et al. | |
| 6,222,234 B1 * | 4/2001 | Imai | 257/347 |
| 6,340,625 B1 | 1/2002 | Choi et al. | |
| 6,362,606 B1 | 3/2002 | Dupuis et al. | |
| 6,392,488 B1 | 5/2002 | Dupuis et al. | |
| 6,500,728 B1 | 12/2002 | Wang | |

(Continued)

OTHER PUBLICATIONS

Office Action issued in U.S. Appl. No. 13/864,798 on Apr. 3, 2014, 24 pgs.

(Continued)

*Primary Examiner* — Yu-Hsi D Sun
(74) *Attorney, Agent, or Firm* — Cantor Colburn LLP; Vazken Alexanian

(57) ABSTRACT

A method of modifying a wafer having a semiconductor disposed on an insulator is provided and includes forming pairs of semiconductor pads connected via respective nanowire channels at each of first and second regions with different initial semiconductor thicknesses and reshaping the nanowire channels into nanowires to each have a respective differing thickness reflective of the different initial semiconductor thicknesses.

3 Claims, 3 Drawing Sheets

(56) References Cited

U.S. PATENT DOCUMENTS

| | | |
|---|---|---|
| 6,504,418 B1 | 1/2003 | Coughlin, Jr. |
| 6,551,881 B1 | 4/2003 | Letavic |
| 6,656,573 B2 | 12/2003 | Chen et al. |
| 6,724,048 B2 | 4/2004 | Min et al. |
| 6,821,913 B2 | 11/2004 | Chuang et al. |
| 6,916,717 B2 | 7/2005 | Li et al. |
| 6,951,792 B1 | 10/2005 | McElheny et al. |
| 6,970,036 B2 | 11/2005 | Mizuno |
| 7,045,398 B2 * | 5/2006 | Yasukawa ............ 438/149 |
| 7,129,554 B2 | 10/2006 | Lieber et al. |
| 7,161,414 B2 | 1/2007 | Mizuno |
| 7,211,464 B2 | 5/2007 | Lieber et |
| 7,224,195 B2 | 5/2007 | Pilling et al. |
| 7,224,232 B2 | 5/2007 | Paul et al. |
| 7,254,151 B2 | 8/2007 | Lieber et al. |
| 7,256,466 B2 | 8/2007 | Lieber et al. |
| 7,329,913 B2 * | 2/2008 | Brask ............ H01L 21/82382 257/287 |
| 7,416,927 B2 | 8/2008 | Gottsche et al. |
| 7,528,004 B2 | 5/2009 | Torii |
| 7,528,403 B1 | 5/2009 | Borselli |
| 7,943,530 B2 | 5/2011 | Sekaric |
| 8,264,192 B2 | 9/2012 | Green et al. |
| 8,420,455 B2 | 4/2013 | Bangsaruntip et al. |
| 2003/0008505 A1 | 1/2003 | Chen et al. |
| 2004/0036127 A1 * | 2/2004 | Chau et al. ............ 257/401 |
| 2004/0166642 A1 * | 8/2004 | Chen et al. ............ 438/284 |
| 2004/0180478 A1 | 9/2004 | Yang et al. |
| 2005/0199919 A1 | 9/2005 | Liu et al. |
| 2007/0075372 A1 | 4/2007 | Terashima et al. |
| 2007/0111419 A1 * | 5/2007 | Doyle ............ H01L 21/82380 438/197 |
| 2007/0122998 A1 | 5/2007 | Droes et al. |
| 2007/0152276 A1 | 7/2007 | Arnold et al. |
| 2007/0187682 A1 | 8/2007 | Takeuchi |
| 2008/0014689 A1 | 1/2008 | Cleavelin et al. |
| 2008/0020537 A1 | 1/2008 | Kim et al. |
| 2008/0061284 A1 | 3/2008 | Chu et al. |
| 2008/0203468 A1 | 8/2008 | Cheng |
| 2008/0206936 A1 | 8/2008 | Fernandez-Ceballos et al. |
| 2008/0211025 A1 | 9/2008 | Gottsche et al. |
| 2008/0213956 A1 | 9/2008 | Black et al. |
| 2008/0253728 A1 | 10/2008 | Sparacin |
| 2008/0293246 A1 | 11/2008 | Cohen et al. |
| 2010/0193770 A1 | 8/2010 | Bangsaruntip et al. |
| 2011/0133280 A1 | 6/2011 | Bangsaruntip et al. |
| 2011/0278539 A1 | 11/2011 | Bangsaruntip et al. |
| 2011/0278543 A1 | 11/2011 | Bangsaruntip et al. |
| 2011/0278544 A1 | 11/2011 | Bangsaruntip |
| 2011/0316565 A1 | 12/2011 | Guo et al. |

OTHER PUBLICATIONS

Office Action issued in U.S. Appl. No. 13/864,798 on Feb. 5, 2015, 17 pgs.

Hubert A. et al: "A stacked SONOS technology, up to 4 levels and 6nm crystalline nanowires, with gate-all-around or independent gates (?-Flash), suitable for full 3D integration", IEEE, Dec. 7, 2009, pp. 1-4.

Pott V. et al: "Fabrication and Characterization of Gate-All-Around Silicon Nanowires on Bulk Silicon", IEEE Transactions on Nanotechnology, Nov. 1, 2008, pp. 733-744.

PCT, ISR/WO issued Dec. 5, 2010, PCT Application No. PCT/EP11/55044, 10 pages.

* cited by examiner

GENERATION OF MULTIPLE DIAMETER NANOWIRE FIELD EFFECT TRANSISTORS

CROSS REFERENCE TO RELATED APPLICATIONS

The present application is a continuation application of co-pending U.S. patent application Ser. No. 12/778,534, which was filed on May 12, 2010. The entire contents of co-pending U.S. patent application Ser. No. 12/778,534 are incorporated herein by reference.

BACKGROUND

Aspects of the present invention are directed to methods of generating of multiple diameter nanowire field effect transistors (FETs).

Nanowire FETs are attracting considerable attention as an option for the design of future complementary-metal-oxide-semiconductor (CMOS) components. While advances are being made, several key issues remain to be considered. Among these, one particular issue is that nanowire FET devices will be required to provide for devices with different drive current strengths and/or different threshold voltages (Vt).

While current solutions to the problem of providing for devices with different drive current strengths and/or different threshold voltages exist, the solutions generally rely upon modulations of device threshold voltages by way of corresponding modulations of the gate work-function. As such, these solutions tend to have relatively difficult and costly process integration operations and, additionally, the solutions tend to present variation concerns.

SUMMARY

In accordance with an aspect of the invention, a method of modifying a wafer having a semiconductor disposed on an insulator is provided and includes forming pairs of semiconductor pads connected via respective nanowire channels at each of first and second regions with different initial semiconductor thicknesses and reshaping the nanowire channels into nanowires to each have a respective differing thickness reflective of the different initial semiconductor thicknesses.

In accordance with an aspect of the invention, a method of modifying a wafer having a semiconductor disposed on an insulator is provided and includes forming pairs of semiconductor pads connected via respective nanowire channels at each of first and second regions, thinning the semiconductor at one of the first and second regions more than at the other and prior to and/or following the thinning, reshaping the nanowire channels into nanowires to each have a respective differing thickness reflective of the thinning.

In accordance with an aspect of the invention, a method of modifying a wafer having a semiconductor disposed on an insulator is provided and includes forming pairs of semiconductor pads connected via respective nanowire channels at first and second regions of the wafer, masking one of the first and second regions of the wafer, thinning the semiconductor of the unmasked region such that the first and second regions have different semiconductor thicknesses and, prior to and/or following the thinning, reshaping the nanowire channels into nanowires to each have a respective differing thickness reflective of the thinning.

In accordance with an aspect of the invention, a method of forming a device on a wafer having a silicon-on-insulator (SOI) structure disposed on a buried oxide (BOX) layer is provided and includes forming pairs of SOI pads connected via respective nanowire channels at first and second regions of the wafer, masking one of the first and second regions of the wafer, thinning the SOI pads and the nanowire channels of the unmasked region such that the SOI pads and the nanowire channels of each of the first and second regions have different material thicknesses and, prior to and/or following the thinning, reshaping the nanowire channels into nanowires to each have a respective differing thickness reflective of the thinning.

In accordance with another aspect of the invention, a system is provided and includes a wafer, including a silicon-on-insulator (SOI) structure disposed on a buried oxide (BOX) layer, the wafer having a first region and a second region, each region having respective pairs of SOI pads connected via respective nanowire channels formed therein and a mask covering one of the first and second regions, the mask preventing a thinning of the other of the first and second regions from having effect at the one of the first and second regions.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

In accordance with aspects of the present invention, nominal, high and low Vt masks are employed to modulate a thickness of an initial silicon on insulator (SOI) structure thickness.

Structures to support, for example, gate-all-around (GAA) nanowire field effect transistors (FETs) as well as methods for fabricating the same are provided by way of descriptions referring to silicon (Si) nanowires and Si processing. However, the present techniques can also be practiced with other semiconductor materials such as, for example, germanium (Ge). When non-Si-containing semiconductors are used, the processing steps of the present teachings are similar and adapted to the specific semiconductor used. Use of Si-containing semiconductor materials such as Si, silicon germanium (SiGe), Si/SiGe, silicon carbide (SiC) or silicon germanium carbide (SiGeC) are therefore understood to be merely exemplary.

Figure 1:
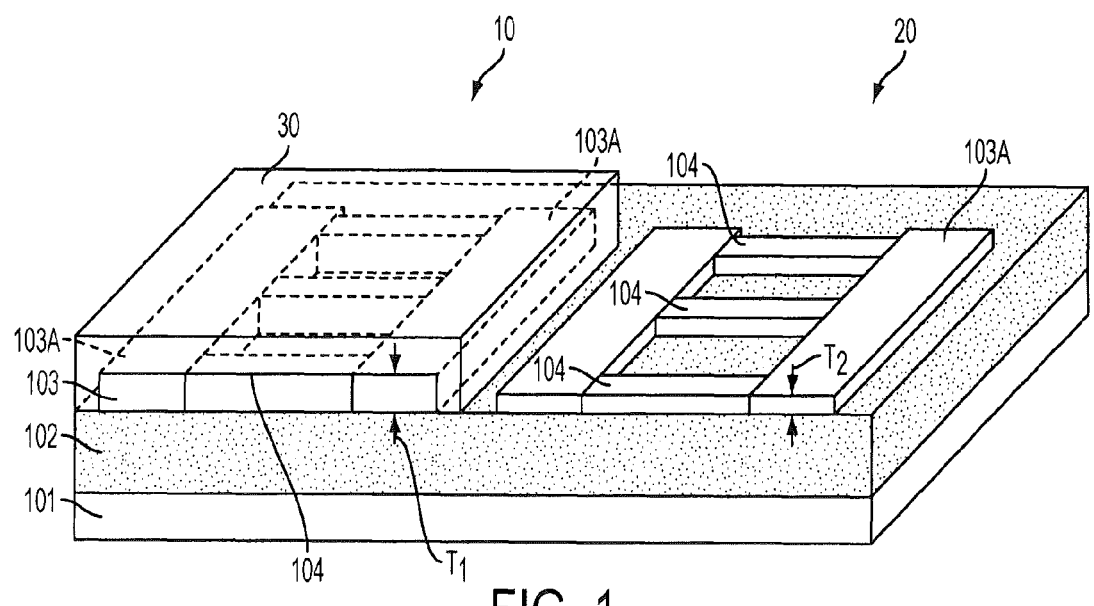
FIG. 1 is a perspective view of the wafer of FIG. 1 having nanowire channels defined thereon at first and second regions.

With reference to FIG. 1, a wafer 1 is provided and includes a Si substrate 101, a buried oxide (BOX) layer 102 and a silicon-on-insulator (SOI) layer 103. The wafer 1 can be fabricated using methods such as Separation by IMplanted OXygen (SIMOX) or wafer bonding (for example, SmartCut™). These wafer fabrication techniques are known to those of skill in the art and thus are not described further herein. Also, the substitution of other SOI substrates known in the art for the SOI on BOX configuration described herein may be made and would be within the scope of the present teachings.

The wafer 1 has at least a first region 10 and a second region 20 established thereon. Pairs of SOI pads 103A and nanowire channels 104 connecting them can be patterned into the SOI layer 103 at the first region 10 and the second region 20 to form, for example, ladder-like structures in each region. The patterning of the nanowire channels 104 and SOI pads 103A may be achieved by lithography (e.g., optical or e-beam) followed by reactive ion etching (RIE) or by sidewall transfer techniques. These patterning techniques are known to those of skill in the art.

The SOI layers 103 at the first and second regions 10 and 20 are each initially formed of similar components with similar thicknesses. However, as shown in FIG. 1, the first region 10 may be masked by mask 30. Mask 30 covers layer 103 in region 10 and thus prevents any modification of layer 103 in region 10. That is, treatments applied to the surface of wafer 1 may modify layer 103 in region 20 but would not substantially affect layer 103 in region 10 due to the masking by mask 30.

Mask 30 is typically a hard mask, such as silicon nitride ($Si_3N_4$), and the treatment that is applied to the surface of wafer 1 could include, for example, an oxidation or etching. An oxidation would convert the exposed surfaces of layer 103 in region 20 to $SiO_2$. Since layer 103 in region 10 is covered with mask 30, however, no substantial oxide forms in or on the layer 103 in region 10. As a result, the silicon portion in layer 103 in region 20 is thinned as compared to that of layer 103 in region 10. Further, when oxidation is used, mask 30 is chosen to be a relatively good oxidation barrier. An example of such masking material is $Si_3N_4$. Etching (wet or dry) can also be used to thin layer 103 in region 20. If etching is used the choice of mask 30 is made to provide relatively good etching resistivity.

With the mask 30 covering the first region 10, the SOI layer 103 of the second region 20 can be thinned while the thickness of the SOI layer 103 of the first region 10 remains substantially constant. As a result, the components of the SOI layer 103 of the first region 10 will have a silicon thickness $T_1$ and the components of the SOI layer 103 of the second region 20 will have a silicon thickness $T_2$ that will be different from and generally thinner than the silicon thickness $T_1$ of the first region 10. These differences in silicon thicknesses may then be manifest in the relative thicknesses of reshaped nanowires 108 to be formed at the first and second regions 10 and 20 (see FIGS. 2 and 4) which will, accordingly, exhibit physical characteristics that may be unique from one another, as will be discussed below.

The thinning of the SOI layer 103 of the second region 20 can be accomplished in one iteration or may be repeated one or more times in order to achieve a selected degree of thinning The thinning may also be coupled with unmasked thinning of SOI layer 103 components at both the first and the second regions 10 and 20. Such unmasked thinning can be conducted such that the unmasked thinning of both the first and second regions 10 and 20 occurs at similar rates and such that a difference between the thicknesses $T_1$ and $T_2$ is maintained.

An alternative method for fabricating a first SOI region 10 with thickness $T_1$ and a second SOI region 20 with thickness $T_2$ relies on the addition of material to region 10. That is, while the method described above involves subtracting material from region 20 by processes such as oxidation or etching, the alternative method involves the addition of material to the layer 103 at region 10.

As an example, the initial thickness of regions 10 and region 20 may be fixed at $T_2$, which could be the initial thickness of the SOI film 103. A mask similar to mask 30 may then be deposited over region 20. This mask may consist of materials such as $SiO_2$ or $Si_3N_4$. Region 10 remains unmasked. The exposed surface of region 10 is then cleaned (for example stripped of any native oxide) and selective silicon epitaxy is applied to the surface of the wafer 1. In an epitaxial process, silicon is added to layer 103 of region 10. The added silicon mimics the same structure of the layer 103, which serves as a template. As a result, layer 103 in region 10 is thickened, to the thickness $T_1$, and the added silicon has substantially the same crystal structure as that of original layer 103 at region 10.

In accordance with embodiments, the epitaxial growth described above is selective. Here, selectivity refers to the addition or deposition of silicon only over silicon surfaces but not over dielectric surfaces. As a result, no silicon is deposited over the mask at region 20 or the buried oxide 102. To obtain selective silicon growth, chlorine-containing Si precursors such as silicon-tetrachloride ($SiCl_4$) and dichlorosilane ($H_2SiCl_2$) are frequently used. A mixture of silane ($SiH_4$) and HCL can also be used. The growth temperature depends on the precursor used. For example, when $SiH_4$ is used a growth temperature higher than 500° C. is needed.

Figure 2:
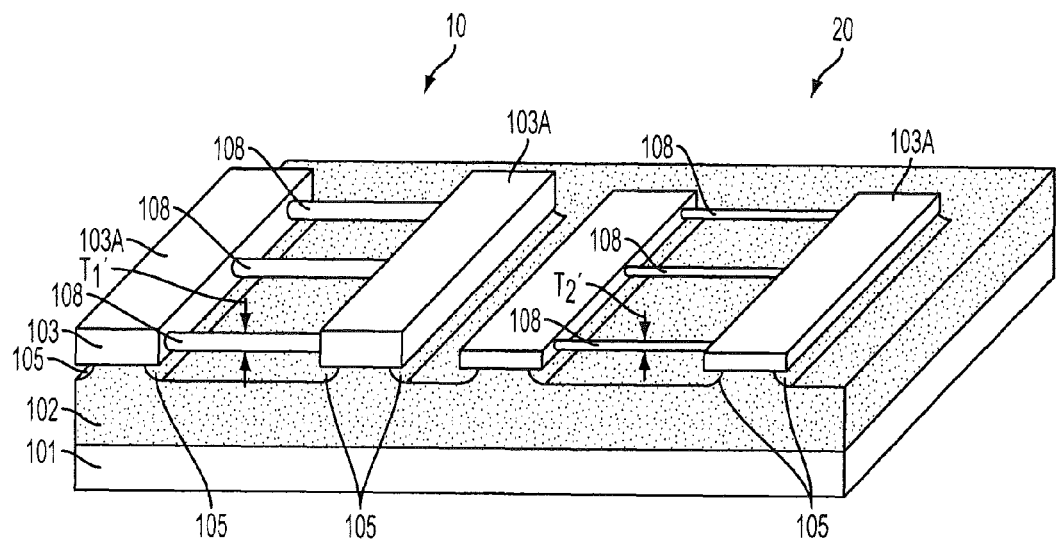
FIG. 2 is a perspective view of the wafer of FIG. 1 having reshaped nanowires defined thereon.

With reference to FIG. 2, the nanowire channels 104 can be reshaped into nanowires 108 and suspended or released from the BOX layer 102 by etching and a recessing of the BOX layer 102. The reshaped nanowires 108 thus form suspended bridges between SOI pads 103A and over recessed oxide 105 in the first and second regions 10 and 20. The recessing of the BOX layer 102 can be achieved with a diluted hydrofluoric (DHF) etch. The lateral component of this etching undercuts the BOX layer 102. Alternatively, suspension may be obtained during an annealing process to form the reshapes nanowires 108. While SOI substrates provide an easy path to define and suspend nanowire channels 104 and/or reshaped nanowires 108, it is possible to obtain suspension with other substrates. For example, a SiGe/Si stack epitaxially grown on bulk Si wafers can also be patterned to form the nanowire channels 104 and/or the reshaped nanowires 108. An SiGe layer can also be used as a sacrificial layer (analogous to the BOX layer 102) which is undercut.

The reshaped nanowires 108 are formed at the first region 10 with final thickness $T_{1'}$ and at the second region 20 with final thickness $T_{2'}$. The reshaping refers to a smoothing of the respective surfaces of the reshaped nanowires 108 to thereby change their respective cross-sections to be increasingly cylindrical and thin by the movement of silicon from the bodies of the reshaped nanowires 108 to the SOI pads 103A. As an example, the reshaped nanowires 108 may be formed by way of an annealing process during which the wafer 1 contacts an inert gas at a temperature, pressure and for a duration sufficient to cause Si migration.

In particular, the wafer 1 may be annealed in an exemplary $H_2$ gas. Shortly before $H_2$ annealing, native oxide may be etched off from the surfaces of the reshaped nanowires 108 and the SOI pads 103A. The annealing in $H_2$ smoothes the nanowire sidewalls, realigns the sidewalls and the SOI pads 103A and re-shapes the nanowire cross-sections from rectangular to cylindrical. The $H_2$ anneal may also thin the bodies of the reshaped nanowires 108 by the Si migration. According to an exemplary embodiment, the inert gas anneal may be performed with a gas pressure of from about 30 torr to about 1000 ton, at a temperature of from about 600 degrees Celsius (° C.) to about 1100° C. and for a duration of about 1-120 minutes. In general, the rate of Si redistribution increases with temperature and decrease with an increase in pressure.

The reshaped nanowires 108 at the first region 10 and having a thickness $T_{1'}$ and the reshaped nanowires 108 at the second region 20 and having a thickness $T_{2'}$ may have different drive currents and/or threshold voltages. In this way, it is understood that circuit characteristics at least at the first and second regions 10 and 20 of the wafer 1 can be controlled by corresponding control of initial silicon thicknesses at the first and second regions 10 and 20 which are partially determinative of the final thicknesses $T_{1'}$ and $T_{2'}$.

The processes for forming the reshaped nanowires 108 at the first and second regions 10 and 20 of the wafer 1 may reshape the nanowires 108 at similar rates or at different unique rates. Thus, as mentioned above, differences between thicknesses $T_{1'}$ and $T_{2'}$ may be similar to the differences between the silicon thicknesses $T_1$ and $T_2$ or, alternatively, the differences between thicknesses $T_{1'}$ and $T_{2'}$ may be increased or decreased as compared to the differences between the silicon thicknesses $T_1$ and $T_2$. For example, the $H_2$ anneal of at the second region 20 may have a greater relative effect than it does at the first region 10 owing to the relative thinness of the SOI layer 103 at the second region 20. More specifically, it was found experimentally that silicon diffusion is typically faster for smaller nanowires. As a result the rate of thinning during $H_2$ annealing will be faster for region 20.

In accordance with further embodiments, both the unmasked thinning and the masked thinning of the SOI layer 103 components at the second region 20 may be conducted prior to and/or following the formation of the reshaped nanowires 108. In the case of the unmasked or masked thinning following the reshaped nanowire 108 formation, it is understood that the thinning rates of the reshaped nanowires 108 at each region may occur at different rates and that, as such, the reshaped nanowires 108 at the second region 20 are to be formed at with sufficient dimensions to persist through the masked thinning.

Figure 3:
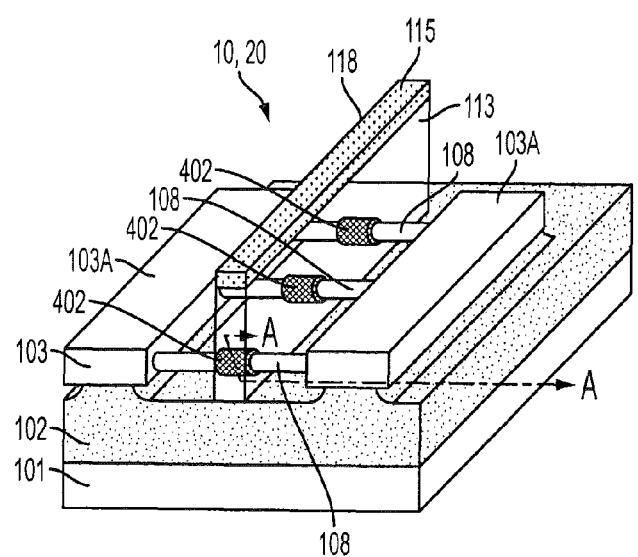
FIG. 3 is a perspective view of a reshaped nanowire having a gate structure.
Figure 4:
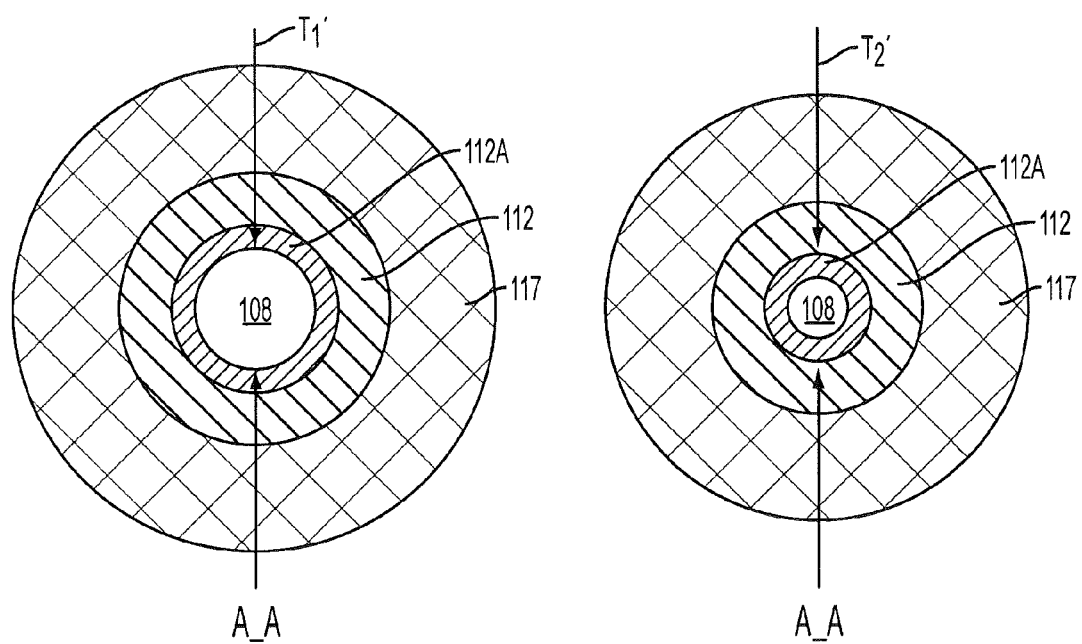
FIG. 4 includes cross-sectional views of nanowires having different thicknesses.

Referring now to FIGS. 3 and 4, a gate structure 402 may be formed around the reshaped nanowires 108. First, the reshaped nanowires 108 are coated with first and second gate dielectrics 112A and 112. The first (and optional) gate dielectric 112A is typically $SiO_2$. The second gate dielectric 112 may include silicon dioxide ($SiO_2$), silicon oxynitride (SiON), hafnium oxide ($HfO_2$) or any other suitable hi-K dielectric(s) and may be deposited using chemical vapor deposition (CVD), atomic layer deposition (ALD) or an oxidation furnace in the case of $SiO_2$ and SiON. A conformal deposition of a thin gate conductor 117 of, e.g., TaN or TiN, may then be formed. This may be followed by a deposition of doped poly-Si 113 to form a gate stack 118 perimetrically surrounding the reshaped nanowires 108. A mask 115 is employed to facilitate the etching of a gate line by, for example, RIE. A portion of the thin gate conductor 117 outside of the gate stack 118 may be removed by RIE or, in an alternate embodiment, the removal of the thin gate conductor 117 from surfaces outside gate stack may require an additional wet etch operation.

Poly-germanium or another suitable composition can be used as a substitute to poly-Si 113. Additionally, any poly-SiGe alloy can also be used to substitute poly-Si 113. Still further, poly-Si 113 can be deposited in a poly-crystalline form or deposited in an amorphous form which is later transformed into poly-Si when exposed to high temperature.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A system, comprising:
   a wafer, including a silicon-on-insulator (SOI) structure disposed on a buried oxide (BOX) layer, the wafer having a first region and a second region,
   the first region having a pair of first SOI pads connected via a first plurality of first nanowire channels formed therein in a first parallel, ladder-like formation, one of the first SOI pads comprising a first exterior face, and
   the second region having a pair of second SOI pads connected via a second plurality of second nanowire channels formed therein in a second parallel, ladder-like formation, which is oriented in parallel and in phase with the first parallel, ladder-like formation such that corresponding ones of the first and second nanowire channels respectively extend longitudinally along a same linear path, one of the second SOI pads comprising a second exterior face; and
   an entirely removable silicon nitride mask directly covering respective entireties of top surfaces and side surfaces of the first SOI pads and the first nanowire channels in only the first region and preventing a thinning of the second SOI pads and the second nanowire channels in the second region due to oxidation from having effect at the top and side surfaces of the first SOI pads and the first nanowire channels in the first region, wherein:
   none of the SOI pads or nanowire channels of the first or the second region directly contact any of the SOI pads or nanowire channels of the second or the first region, respectively, such that the first and second exterior faces are disposed in parallel to oppositely face one another at a distance.

2. A system, comprising:
   a silicon-on-insulator (SOI) wafer having a first region with a first SOI pad pair connected via first nanowire channels formed therein in a first parallel, ladder-like arrangement and a second region with a second SOI pad pair connected via second nanowire channels formed therein in a second parallel, ladder-like arrangement oriented in parallel and in phase with the first parallel, ladder-like formation such that corresponding ones of the first and second nanowire channels respectively extend longitudinally along a same linear path; and
   an entirely removable silicon nitride mask directly covering respective entireties of top surfaces and side surfaces of the SOI pads and nanowire channels in only the first region and preventing a thinning of the SOI pads and nanowire channels in the second region due to oxidation from having a same effect in the first region, wherein:

none of the SOI pads or nanowire channels of the first or the second region directly contact any of the SOI pads or nanowire channels of the second or the first region, respectively.

3. A system, comprising:
a silicon-on-insulator (SOI) wafer having a first region and a second region;
a first SOI pad pair connected via first nanowire channels formed in the first region in a first parallel, ladder-like arrangement;
a second SOI pad pair connected via second nanowire channels formed in the second region in a second parallel, ladder-like arrangement,
the first and second parallel, ladder-like arrangements being oriented in parallel and in phase with each other such that corresponding ones of the first and second nanowire channels respectively extend longitudinally along a same linear path,
wherein none of the SOI pads or nanowire channels of the first region directly contact any of the SOI pads or nanowire channels of the second region; and
a mask directly covering respective entireties of top surfaces and side surfaces of the first SOI pad pair and the first nanowire channels in only the first region.

* * * * *